(12) United States Patent
Zhou

(10) Patent No.: US 10,804,260 B2
(45) Date of Patent: Oct. 13, 2020

(54) SEMICONDUCTOR STRUCTURE WITH DOPED LAYERS ON FINS AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 165 days.

(21) Appl. No.: 16/025,576

(22) Filed: Jul. 2, 2018

(65) Prior Publication Data
US 2019/0006351 A1    Jan. 3, 2019

(30) Foreign Application Priority Data
Jul. 3, 2017 (CN) .......................... 2017 1 0533460

(51) Int. Cl.
*H01L 31/062* (2012.01)
*H01L 29/94* (2006.01)
(Continued)

(52) U.S. Cl.
CPC .... *H01L 27/0629* (2013.01); *H01L 21/02529* (2013.01); *H01L 21/02532* (2013.01); *H01L 21/02636* (2013.01); *H01L 21/26513* (2013.01); *H01L 21/746* (2013.01); *H01L 21/823814* (2013.01); *H01L 21/823821* (2013.01); *H01L 27/0727* (2013.01); *H01L 27/0924* (2013.01);
(Continued)

(58) Field of Classification Search
CPC .......... H01L 27/0629; H01L 21/02529; H01L 21/02532; H01L 21/02636; H01L 21/26513; H01L 21/746; H01L 21/823814; H01L 21/823821; H01L 27/0727; H01L 27/0924; H01L 29/0657; H01L 29/0688; H01L 29/0847; H01L 29/1608; H01L 29/165; H01L 29/167
See application file for complete search history.

(56) References Cited

U.S. PATENT DOCUMENTS 8,883,585 B1 * 11/2014 Fumitake .............. H01L 29/785
257/E21.4
10,354,993 B2 * 7/2019 Zhou ................... H01L 29/0649
(Continued)

*Primary Examiner* — Alonzo Chambliss
(74) *Attorney, Agent, or Firm* — Anova Law Group, PLLC

(57) ABSTRACT

Semiconductor structures and fabrication methods are provided. An exemplary fabrication method includes providing a semiconductor substrate having at least one diode region; forming at least one first fin on the semiconductor substrate in the diode region; forming a first doped layer containing a first type of doping ions having a first conductivity in the first fin; and forming a second doped layer doped containing a second type of doping ions having a second conductivity opposite to the first conductivity on the first doped layer. A size of an interface between the first doped layer and the second doped layer along a width direction of the first fin is greater than a width of the first fin.

20 Claims, 4 Drawing Sheets

(51) Int. Cl.
    *H01L 21/8238* (2006.01)
    *H01L 21/336* (2006.01)
    *H01L 27/06* (2006.01)
    *H01L 21/02* (2006.01)
    *H01L 29/167* (2006.01)
    *H01L 29/08* (2006.01)
    *H01L 27/092* (2006.01)
    *H01L 29/06* (2006.01)
    *H01L 29/861* (2006.01)
    *H01L 29/66* (2006.01)
    *H01L 21/265* (2006.01)
    *H01L 29/165* (2006.01)
    *H01L 29/16* (2006.01)
    *H01L 21/74* (2006.01)
    *H01L 27/07* (2006.01)
    *H01L 29/36* (2006.01)

(52) U.S. Cl.
    CPC ...... *H01L 29/0657* (2013.01); *H01L 29/0688* (2013.01); *H01L 29/0847* (2013.01); *H01L 29/165* (2013.01); *H01L 29/167* (2013.01); *H01L 29/1608* (2013.01); *H01L 29/66136* (2013.01); *H01L 29/861* (2013.01); *H01L 21/823807* (2013.01); *H01L 21/823878* (2013.01); *H01L 29/36* (2013.01)

(56) References Cited

U.S. PATENT DOCUMENTS

| | | | |
|---|---|---|---|
| 2008/0185691 A1* | 8/2008 | Cheng | H01L 29/0649 257/656 |
| 2009/0315112 A1* | 12/2009 | Lee | H01L 27/0248 257/355 |
| 2016/0111537 A1* | 4/2016 | Tsai | H01L 27/0886 257/192 |
| 2016/0197075 A1* | 7/2016 | Li | H01L 21/823807 257/369 |
| 2017/0062280 A1* | 3/2017 | Li | H01L 27/0924 |
| 2017/0236822 A1* | 8/2017 | Tung | H01L 27/0924 257/376 |

* cited by examiner

SEMICONDUCTOR STRUCTURE WITH DOPED LAYERS ON FINS AND FABRICATION METHOD THEREOF

CROSS-REFERENCES TO RELATED APPLICATIONS

This application claims the priority of Chinese patent application No. 201710533460.4, filed on Jul. 3, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the continuous development of semiconductor technologies, the semiconductor devices have been developed toward high integration level and high quality; and the critical dimension (CD) of the semiconductor devices have been continuously reduced. The reduction of the critical dimension of the semiconductor devices allows more semiconductor devices to be formed in a single chip.

Semiconductor diodes, also called crystal diodes, or diodes, are common electronic devices in the field of semiconductor. A PN junction is often formed in the diode. Such a device allows a current to flow only along one direction; and blocks the flow of the current along another direction according to the direction of the external electric field. The PN junction is an interface formed by a P-type semiconductor material and an N-type semiconductor material. At two sides of the interface, space charge layers are formed; and a build-in field is generated. When the external electrical field is zero, the diffusion current induced by the carrier concentration difference at two sides of the PN junction and the drift current induced by the build-in field are equal; and the PN junction is at an equilibrium state. The semiconductor diodes are used in almost all the electrical circuits; and play important roles in many electrical circuits.

With the continuous shrinkage of the critical dimension of the semiconductor devices, the interface area of the PN junction in the diode has be continuously reduced; and the performance of the diode is reduced as well. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having at least one diode region; forming at least one first fin on the semiconductor substrate in the diode region; forming a first doped layer containing a first type of doping ions having a first conductivity in the first fin; and forming a second doped layer doped containing a second type of doping ions having a second conductivity opposite to the first conductivity on the first doped layer. A size of an interface between the first doped layer and the second doped layer along a width direction of the first fin is greater than a width of the first fin.

Another aspect of the present disclosure includes a semiconductor structure. The semiconductor structure includes a semiconductor substrate having at least one diode region and at least one first fin on the semiconductor in the diode region; a first doped layer containing a first type of doping ions having a first conductivity formed in the first fin; and a second doped layer a second type of doping ions having a second conductivity opposite to the first conductivity on the first doped layer. A size of an interface between the first doped layer and the second doped layer along a width direction of the first fin is greater than a width of the first fin.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
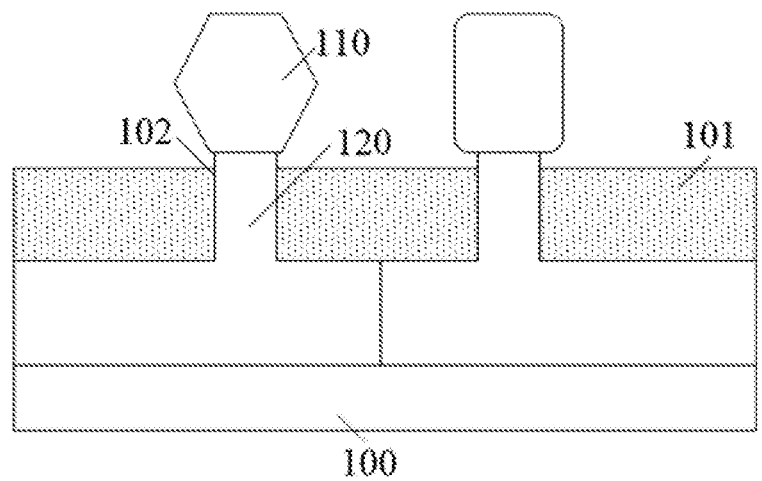
FIG. 1 illustrates a semiconductor structure.

FIG. 1 illustrates a semiconductor structure. As shown in FIG. 1, the semiconductor structure includes a semiconductor substrate 100 and a plurality of fins 102 on the semiconductor substrate 100. Each of the fins 102 includes a doped region 120 doped with a first type of doping ions. Each of the fins 102 also includes a doped layer 110 doped with a second type of doping ions. The conductive type of the first type of doping ions is opposite to the conductive type of the second type of doping ions.

The doped regions 120 and the doped layers 110 form PN junctions. The contact surfaces between the doped regions 120 and the doped layers 110 are the p-n junction interfaces. The size of the p-n junction interface along the extending direction of the fin 102 is the width of the fin 102. Because the width of the fin 102 is relatively small, the size of the p-n junction interface along the width direction of the fin 102 is relatively small; and the area of the p-n junction interface is relatively small. Thus, the on-current of the diode formed by the doped region 120 and the doped layer 110 is relatively small; and the performance of the semiconductor structure may not be as desired.

The present disclosure provides a semiconductor structure and a fabrication method of the semiconductor structure. The fabrication method may include proving a semiconductor substrate having a diode region; forming at least one fin on the semiconductor substrate in the diode region; forming a first doped layer in the fin and forming a second doped layer on the first doped layer. The size of the interface between the first doped layer and the second doped layer along the width direction of the fin is greater than the width of the fin. Thus, the contact area between the first doped layer and the second doped layer may be relatively large. Accordingly, the area of the p-n junction interface may be relatively large. Thus, the contact resistance between the first doped layer and the second doped layer may be reduced; and the performance of the semiconductor structure may be improved.

Figure 9:
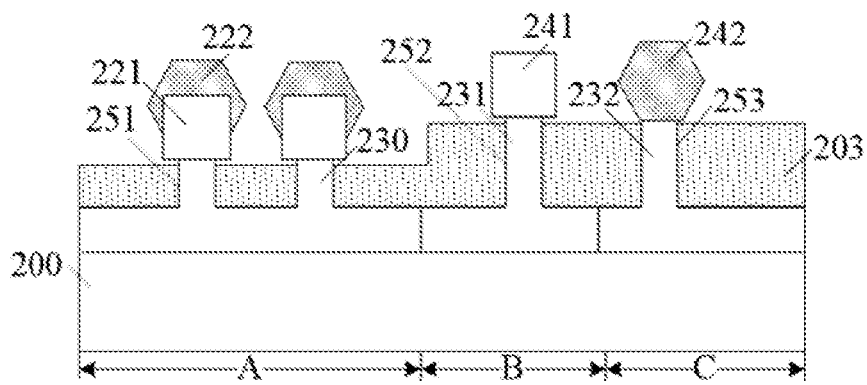
Figure 10:
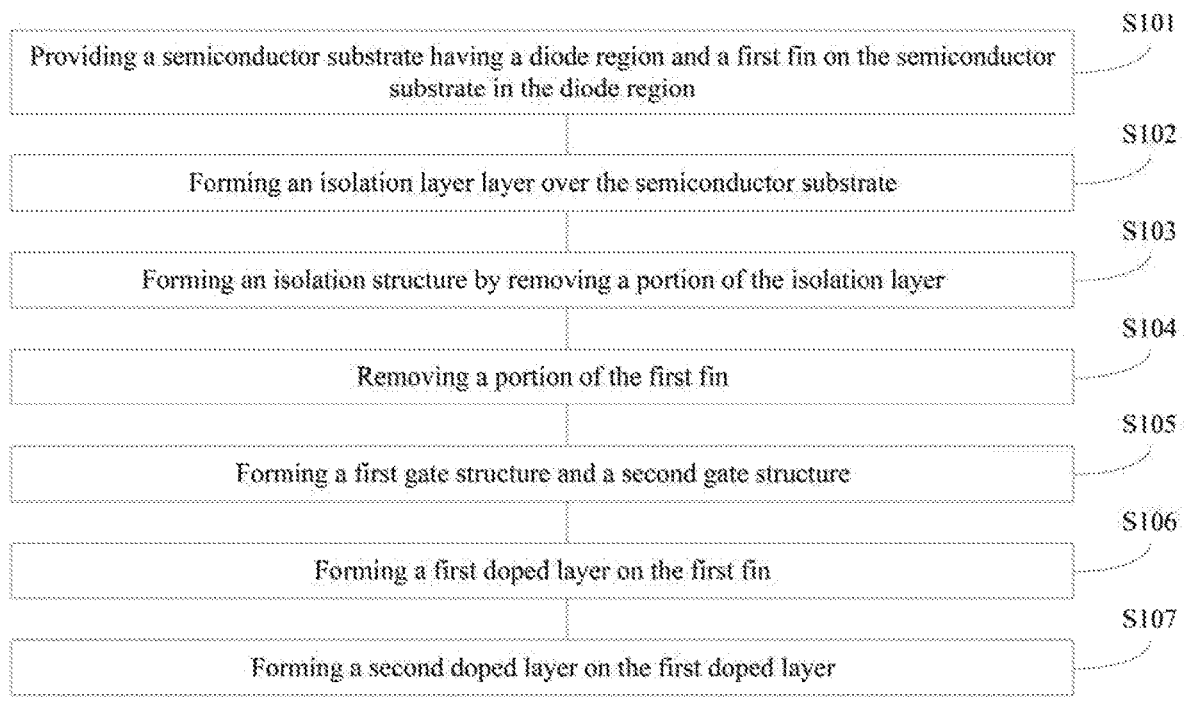
FIG. 10 illustrates an exemplary fabrication process of a semiconductor structure consistent with various disclosed embodiments.

FIG. 10 illustrates an exemplary fabrication process of a semiconductor structure consistent with various disclosed embodiments. FIGS. 2-9 illustrate structures corresponding to certain stages during the exemplary fabrication process.

Figure 2:
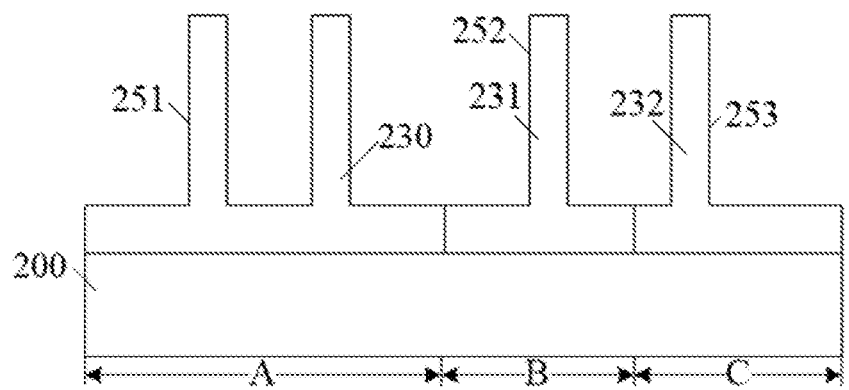
FIGS. 2-9 illustrate structures corresponding to certain stages during an exemplary fabrication process of a semiconductor structure consistent with various disclosed embodiments.

As shown in FIG. 10, at the beginning of the fabrication process, a semiconductor substrate is provided (S101). FIG. 2 illustrates a corresponding semiconductor structure.

As shown in FIG. 2, a semiconductor substrate 200 is provided. The semiconductor substrate 200 may include at least a diode region "A". A plurality of first fins 251 may be formed on the semiconductor substrate 200 in the diode region "A". For illustrative purposes, two first fins 251 are illustrated.

In one embodiment, the semiconductor substrate 200 may also include a first MOS transistor region "B" and a second MOS transistor region "C". In some embodiments, the semiconductor substrate may not include a first MOS transistor region and a second MOS transistor region. In other embodiments, the semiconductor substrate may include one of a first MOS transistor region and a second MOS transistor region.

In one embodiment, the diode region "A" may be used to form a diode (s). The first MOS transistor region "B" may be used to form an NMOS transistor (s). The second MOS transistor region "C" may be used to form a PMOS transistor (s).

One or more second fins 252 may be formed on the semiconductor substrate 200 in the first MOS transistor region "B". One or more third fins 253 may be formed on the semiconductor substrate 200 in the second MOS transistor region "C".

In one embodiment, the semiconductor substrate 200, the first fins 251, the second fin 252 and the third fin 253 are made of silicon. In some embodiments illustrated in FIG. 2, the semiconductor substrate, the first fins, the second fin, and the third fin may be made of other appropriate semiconductor material, such as germanium, or silicon germanium, etc.

The process for forming the first fins 251, the second fin 252, the third fin 253 and the semiconductor substrate 200 may include providing a base substrate; performing a first patterning process on the base substrate to form the semiconductor substrate 200, the first fins 251 on the semiconductor substrate 200 in the diode region "A", the second fin 252 on the semiconductor substrate 200 in the first MOS transistor region "B", and the third fin 253 on the semiconductor substrate 200 in the second MOS transistor region "C".

In one embodiment, as shown in FIG. 2, before patterning the base substrate, an ion implantation process may be performed on the base substrate to implant doping ions in the first fins 251 to form a doped region 230 in each of the first fins 251. In some embodiments, the doped regions may be formed after performing the first patterning process by performing an ion implantation process.

In one embodiment, the doping ions may be N-type ions, such as phosphorus ions, arsenic ions, or antimony ions, etc. In some embodiments, the doping ions may also be P-type ions, such as boron ions, or $BF_2^+$ ions, etc.

Further, as shown in FIG. 2, a first well region 231 may be in the first MOS transistor region "B". The first well region 231 may be doped with first well ions. A second well region 232 may be formed in the second MOS transistor region "C". The second well region 232 may be doped with second well ions.

In one embodiment, before performing the first patterning process, an ion implantation process may be performed on the base substrate in the first MOS transistor region "B" to implant the first well ions in the base substrate in the first MOS transistor region "B" to form the first well region 231. In some embodiments, after performing the first patterning process, an ion implantation process may be performed to the second fin to form the first well region.

In one embodiment, the first MOS transistor region "B" may be used to form an NMOS transistor, the first well ions may be P-type ions, such as boron ions, or $BF_2^+$ ions, etc. In some embodiments, the first MOS transistor region may be used to form a PMOS transistor, the first well ions may be N-type ions, such as phosphorus ions, arsenic ions, or antimony ions, etc.

In one embodiment, before performing the first patterning process, an ion implantation process may be performed on the base substrate in the second MOS transistor region "C" to implant the second well ions in the base substrate in the second MOS transistor region "C" to form the second well region 232. In some embodiments, after performing the first patterning process, an ion implantation process may be performed to the third fin to form the second well region.

In one embodiment, the second MOS transistor region "C" may be used to form a PMOS transistor, the second well ions may be N-type ions, such as phosphorus ions, arsenic ions, or antimony ions, etc. In some embodiments, the second MOS transistor region may be used to form an NMOS transistor, the second well ions may be P-type ions, such as boron ions, or $BF_2^+$ ions, etc.

Figure 3:
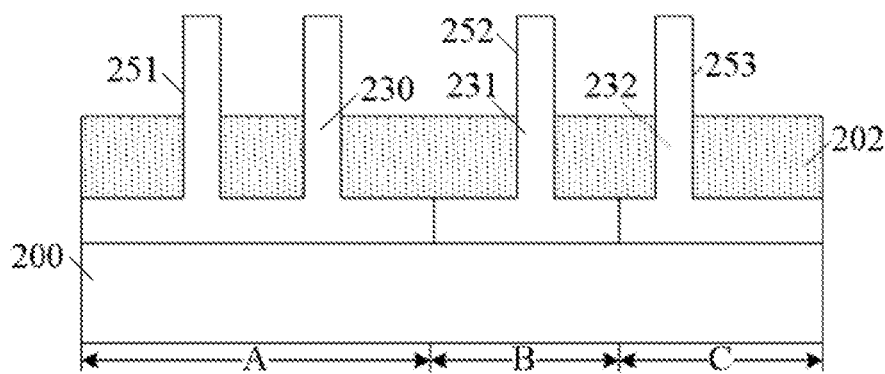

Returning to FIG. 10, after providing the semiconductor substrate with the certain structures, an isolation layer may be formed (S102). FIG. 3 illustrates a corresponding semiconductor structure.

As shown in FIG. 3, an isolation layer 202 is formed on the semiconductor substrate 200 in the diode region "A", the first MOS transistor region "B" and the second MOS transistor region "C". The isolation layer 202 may cover the portions of the sidewall surfaces of the first fins 251, the second fin 252 and the third fin 253; and the top surface of the isolation layer 202 may be lower than the top surfaces of the first fins 251, the second fin 252 and the third fin 253.

The isolation layer 202 may be used to subsequently form an isolation structure to isolate adjacent first fins 251.

In one embodiment, the isolation layer 202 is made of silicon oxide. In some embodiments, the isolation layer may be made of silicon nitride, or silicon oxynitride, etc.

In one embodiment, the process for forming the isolation layer 202 may include forming an initial isolation layer on the semiconductor substrate 200 in the diode region "A", the first MOS transistor region "B" and the second MOS transistor region "C"; and etching the initial isolation layer such that the surface of the etched initial isolation layer lower than the top surfaces of the first fins 251, the second fin 252 and the third fin 253. Thus, the isolation layer 202 may be formed by the etched initial isolation layer.

In one embodiment, the initial isolation layer is formed by a flowable chemical vapor deposition (FCVD) process. In some embodiments, the initial isolation layer may be formed by a physical vapor deposition (PVD) process, or a high aspect ratio deposition process, etc.

In one embodiment, the initial isolation layer may be etched by a dry etching process and/or a wet etching process to form the isolation layer 202.

In one embodiment, the surface of the portion of the isolation layer 202 in the diode region "A", the surface of the portion of the isolation layer 202 in the first MOS transistor region "B" and the surface of the portion of the isolation layer 202 in the second MOS transistor region "C" may level with each other.

Figure 4:
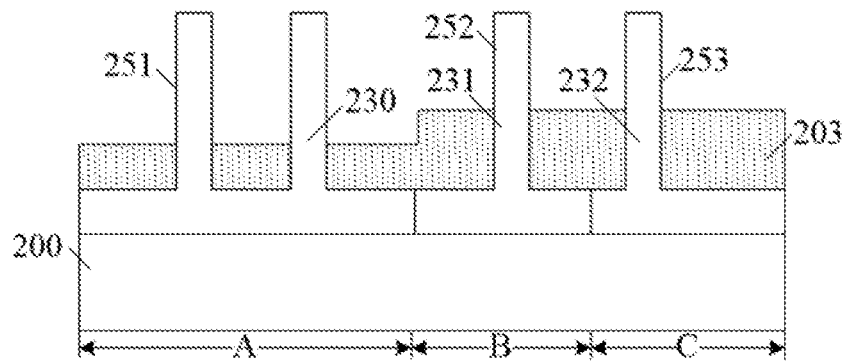

Returning to FIG. 10, after forming the isolation layer, an isolation structure may be formed (S103). FIG. 4 illustrates a corresponding semiconductor structure.

As shown in FIG. 4, an isolation structure 203 is formed. The isolation structure 203 may be formed by removing a partial thickness of the portion of the isolation layer 202 in the diode region "A" to cause the surface of the portion of the isolation layer 202 in the diode region "A" to be lower than the surface of the portion of the isolation layer 202 in the first MOS transistor region "B" and lower than the surface of the portion of the isolation layer 202 in the second MOS transistor region "C".

By removing the partial thickness of the portion of the isolation layer 202 in the diode region "A" to cause the surface of the portion of the isolation layer 202 in the diode region "A" to be lower than the surface of the portion of the isolation layer 202 in the first MOS transistor region "B" and lower than the surface of the portion of the isolation layer 202 in the second MOS transistor region "C" may facilitate subsequent removal of portions of the first fins 251.

The partial thickness of the portion of the isolation layer 202 in the diode region "A" may be removed by any appropriate process, such as a dry etching process, or a wet etching process, etc.

If the partial thickness, i.e., the thickness of the removed portion of the isolation layer 202, is too small, it may not sufficiently facilitate the subsequent removal of the portions of the first fins 251. If the partial thickness is too large, the isolation performance of the isolation structure 203 may be reduced. Thus, the partial thickness may be in range of approximately 150 Å-400 Å.

Figure 5:
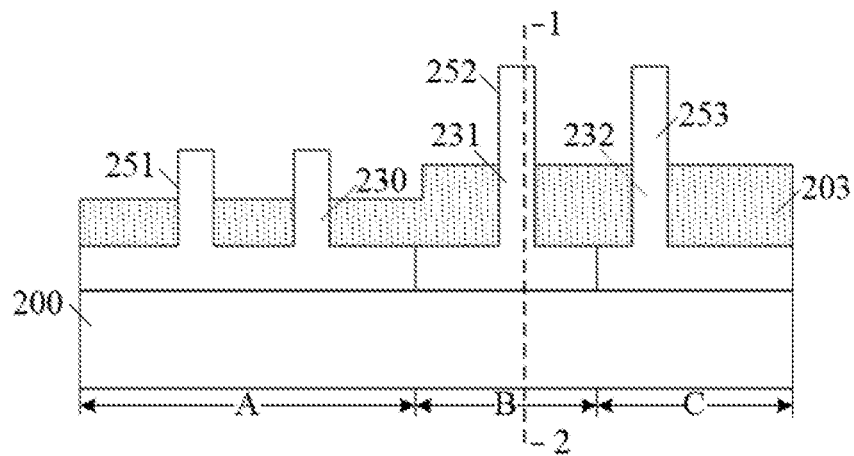

Returning to FIG. 10, after removing the partial thickness of the isolation layer in the diode region, portions of the first fins may be removed (S104). FIG. 5 illustrates a corresponding semiconductor structure.

As shown in FIG. 5, a top portion of each of the first fins 251 may be removed to cause the top surfaces of the first fins 251 to be lower than the top surface of the second fin 252 and lower than the top surface of the third fin 252.

Removing the top portions of the first fins 251 to cause the top surfaces of the first fins 251 to be lower than the top surface of the second fin 252 and lower than the top surface of the third fin 252 may be able to reduce the height of the top surface of a subsequently formed second doped layer. Accordingly, the damage to the second doped layer during subsequent planarization of the dielectric layer may be prevented.

In one embodiment, the portions of the first fins 251 may be removed by a dry etching process, or a wet etching process.

If the height of the removed portion of the first fins 251 is too small, it may not aid to reduce the height of the subsequently formed second doped layer. Accordingly, it may not aid to reduce the damage to the second doped layer during subsequently planarizing the dielectric layer. If the height of the removed portion of the first fin 251 is too large, it may be easy to form dent defects on the subsequently formed dielectric layer in the diode region "A"; and the insulation properties of the dielectric layer may be reduced. Thus, the height of the removed portion of the first fins 251 may be in a range of approximately 500 Å-1000 Å.

Figure 6:
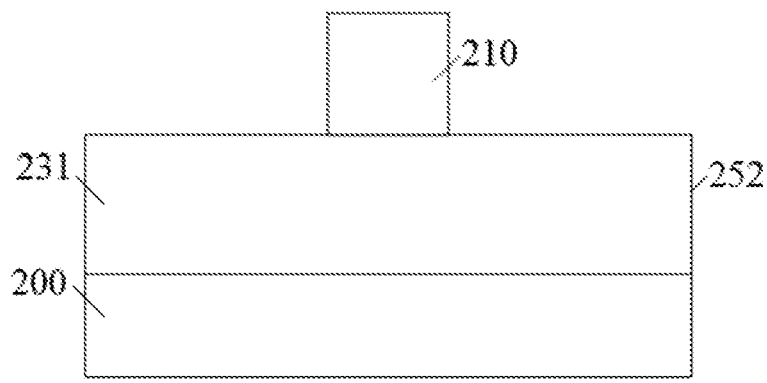

Returning to FIG. 10, after removing the portions of the first fins, a first gate structure and a second gate structure may be formed (S105). FIG. 6 illustrates a corresponding semiconductor structure. FIG. 6 is a cross-sectional view of the structure illustrated in FIG. 5 along "1-2" direction.

As shown in FIGS. 5-6, a first gate structure 210 may be formed over the second fin 252. The first gate structure 210 may cover portions of the top and sidewall surfaces of the second fin 252. Further, a second gate structure (not shown) may be formed over the third fin 253. The second gate structure may cover portions of the top and sidewall surfaces of the third fin 253.

In one embodiment, the process for forming the first gate structure and the second gate structure may include forming an initial gate electrode layer to cover the sidewall and top surfaces of the first fins 251, the second fin 252 and the third fin 253; and performing a second patterning process to remove the portion of the initial gate electrode layer on the diode region "A" and form the first gate structure 210 in the first MOS transistor region "B" and the second gate structure in the second MOS transistor region "C".

Figure 7:
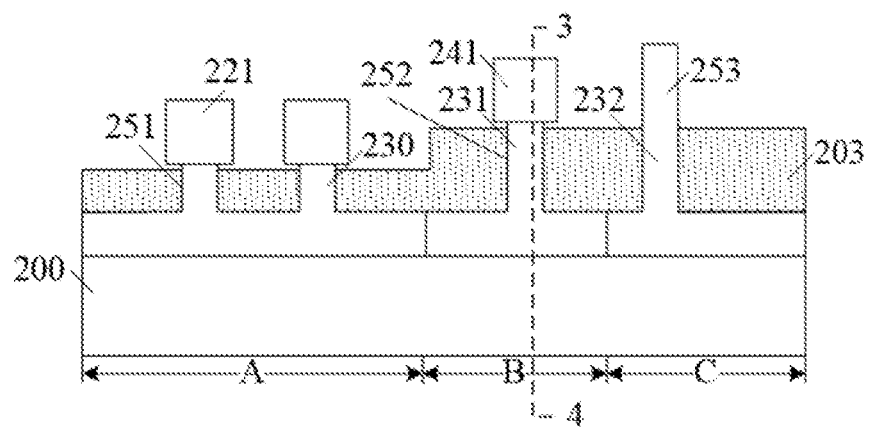

Returning to FIG. 10, after forming the first gate structure and the second gate structure, a first doped layer may be formed in the first fins (S106). FIG. 7 illustrates a corresponding semiconductor.

As shown in FIG. 7, a first doped layer 221 may be formed in the first fins 251. The first doped layer 221 may be doped to have a first conductivity with a first type of doping ions.

Figure 8:
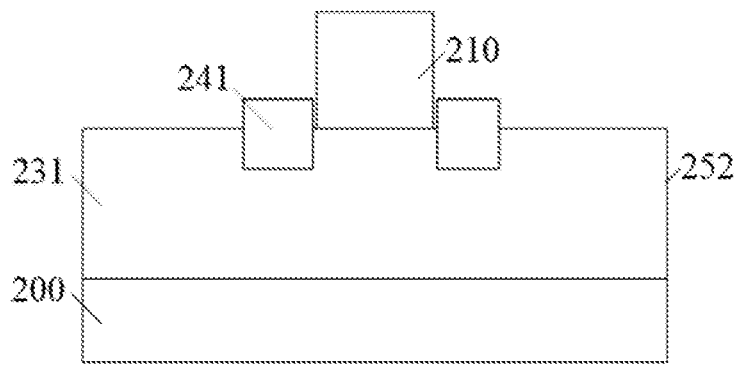

In one embodiment, as shown in FIG. 8, a first doped source/drain layer 241 may be formed in the second fin 252. FIG. 8 is a cross-sectional view of the semiconductor structure illustrated in FIG. 7 along the "3-4" direction. The first doped source/drain layer 241 may be doped with a first type of source/drain doping ions.

The conductive type of the first type of source/drain doping ions for the first doped source/drain layer 241 may be the same as the conductive type of the first type of doping ions for the first doped layer 221. In one embodiment, the first type of doping ions may be N-type ions. The first type of source/drain doping ions may also be N-type ions. In some embodiments, the first type of doping ions may be P-type ions; and the first type of source/drain doping ions may also be P-type ions.

In one embodiment, the first type of doping ions may include phosphorus ions, arsenic ions, or antimony ions.

In one embodiment, the process for forming the first doped layer 221 and the first doped source/drain layer 241 may include forming a first epitaxial layer on the first fins 251 and the second fin 252; performing a first doping process on the first epitaxial layer to form the first doped layer 221 in the diode region "A" and the first doped source/drain layer 241 in the first MOS transistor region "B".

In one embodiment, the first doped layer 221 and the first doped source/drain layer 241 are made of a same material. Thus, the first doped layer 221 and the first doped source/drain layer 241 may be formed by a same process; and the fabrication process may be simplified. In some embodiments, the first doped layer and the first doped sourced/drain layer may be made of different materials; and may be formed by different processes.

The process for forming the first epitaxial layer may include forming an opening in each of the first fins 251. The opening may pass through the first fin 251 along the width direction of the first fin 251. Then, the first epitaxial layer may be formed in the opening by a first epitaxial growth process.

In one embodiment, the first MOS transistor region "B" may be used to form an NMOS transistor. The first epitaxial layer may be made of silicon, or silicon carbide, etc. In some embodiments, the first MOS transistor region may be used to form a PMOS transistor, the first epitaxial layer may be made of silicon germanium, etc.

The first epitaxial layer may be formed by a first epitaxial growth process. During the first epitaxial growth process, an in-situ doping process may be performed to dope the first epitaxial layer to form the first doped layer and the first doped source/drain layer.

In some embodiments, a first ion implantation process may be performed after forming the first epitaxial layer to form the first doped layer and the first doped source/drain layer.

In one embodiment, the concentration of the first doping ions in the first epitaxial layer 221 may be in a range of approximately 1.0E20 atoms/cm$^3$-2.5E21 atoms/cm$^3$. The concentration of the first source/drain doping ions in the first doped source/drain layer 241 may be in a range of approximately 1.0E20 atoms/cm$^3$-3.0 E21 atoms/cm$^3$.

Returning to FIG. 10, after forming the first epitaxial layer and the first doped source/drain layer, a second doped layer may be formed (S107). FIG. 9 illustrates a corresponding semiconductor structure.

As shown in FIG. 9, a second doped layer 222 may be formed on the surface of the first doped layer 221. The second doped layer 222 may be doped to have a second conductivity with a second type of doping ions. The conductive type of the second type of doping ions in the second doped layer 222 may be opposite to the conductive type of the first type of doping ions in the first doped layer 221. The area of the interface between the second doped layer 222 and the first doped layer 221 along the width direction of the first fin 251 may be greater than the width of the first fin 251.

In one embodiment, the second doped layer 222 may be doped with a second type of doping ions. The conductive type of the second type of doping ions may be opposite to the conductive type of the first type of doping ions. Thus, a diode may be formed by the first doped layer 222 and the first doped layer 221. The interface between the first doped layer 221 and the second doped layer 222 may be the p-n junction interface of the diode. The area of the interface between the second doped layer 222 and the first doped layer 221 along the width direction of the first fin 251 may be greater than the width of the first fin 251. Thus, the area of the interface between the first doped layer 221 and the second doped layer 222 may be relatively large. Accordingly, the area of the p-n junction interface of the diode may be relatively large. Therefore, the on-current of the diode may be increased; and the performance of the diode may be improved.

In one embodiment, as shown in FIG. 9, a second doped source/drain layer 242 may be formed in the third fin 252. The second doped source/drain layer 242 may be doped with a second type of source/drain doping ions. The conductive type of the second type of source/drain doping ions in the second doped source/drain layer 242 may the same as the conductive type of the second type of doping ions in the second doped layer 222.

In some embodiments, the semiconductor substrate may not include a second MOS transistor region. Thus, the process for forming the second doped source/drain layer may be omitted.

In one embodiment, the second doped source/drain layer 242 may be formed in the third fin 253 at both sides of the second gate structure.

In one embodiment, the second doped layer 222 may be used to form the anode of the diode. In some embodiments, the second doped layer may be used to form the anode of the diode; and may also be used to form the cathode of the diode.

The conductive type of the second type of doping ions may be opposite to the conductive type of the first type of doping ions. For example, in one embodiment, the first type of doping ions are N-type doping ions, the second type of doping ions are P-type ions. In some embodiments, the first type of doping ions may be P-type ions, the second type of doing ions may be N-type ions.

In one embodiment, the second type of doping ions may be $BF_2^{2+}$ ions, etc.

In one embodiment, the process for forming the second doped layer 222 and the second doped source/drain layer 242 may include forming a second epitaxial layer on the surface of the first doped layer 221 and in the third fin 253; and performing a second doping process on the second epitaxial layer to form the second doped layer 222 on the first doped layer 221 and form the second doped source/drain layer 242 in the third fin 253.

In one embodiment, the second doped layer 222 and the second doped source/drain layer 242 may be made of a same material. Thus, the second doped layer 222 and the second doped source/drain layer 242 may be formed by a same process; and the fabrication process may be simplified. In some embodiments, the second doped layer and the second doped source/drain layer may be made of different materials; and may be formed by different processes.

In one embodiment, the second MOS transistor region "C" may be used to form a PMOS transistor, the second epitaxial layer may be made of silicon germanium, or silicon, etc. In some embodiments, the second MOS transistor region may be used to form an NMOS transistor region, the second epitaxial layer may be made of silicon carbide, etc.

The second doping process may include in-situ doping the second epitaxial layer during the second epitaxial growth process.

In some embodiments, the second doping process may also include performing a second ion implantation process to form the second doped layer and the second doped source/drain layer after forming the second epitaxial layer.

In one embodiment, the concentration of the second doping ions in the second doped layer 222 may be in a range of approximately 1.0E21 atoms/cm$^3$-2.5E21 atoms/cm$^3$. For example, the concentration of the second doping ions in the second doped layer 222 may be approximately 1.2E21 atom/cm$^3$. The concentration of the second source/drain doping ions in the second doped source/drain layer 242 may be in a range of approximately 7.0E20 atoms/cm$^3$-9.0E20 atoms/cm$^3$. For example, the concentration of the second source/drain doping ions in the second doped source/drain layer 242 may be approximately 8.0E20 atoms/cm$^3$.

In one embodiment, after forming the second doped layer 222 and the second doped source/drain layer 242, an initial dielectric layer may be formed over the semiconductor substrate 200 in the diode region "A", the first MOS transistor region "B" and the second MOS transistor region "C". The initial dielectric layer may cover the second doped layer 222, the first doped source/drain layer 241 and the second doped source/drain layer 242. Then, a planarization process may be performed on the initial dielectric layer to form a dielectric layer.

The present disclosure also provides a semiconductor structure. FIG. 9 illustrates a corresponding semiconductor structure consistent with various disclosed embodiments.

As shown in FIG. 9, the semiconductor structure may include a semiconductor substrate 200 having at least a diode region "A" and a plurality of fins 251 formed on the semiconductor substrate 200 in the diode region "A"; a first doped layer 221 doped to have a first conductivity with a first type of doping ions formed in the first fins 251; and a second doped layer 222 doped to have a second conductivity with a second type of doped ions with the second conductivity opposite to the first conductivity on the first doped layer 221. The size of the interface between the second doped layer 222 and the first doped layer 221 along the width direction of the first fin 251 may be greater than the width of the first fin 251. The detailed structures and intermediate structures are described above with respect to the fabrication processes.

The first doped layer 221 may be made of silicon, silicon germanium, or silicon carbide, etc., doped with the first type of doping ions. The second doped layer 222 may be made of silicon, silicon germanium, or silicon carbide, etc., doped with the second type of doping ions.

In one embodiment, the semiconductor substrate 200 may also include a first MOS transistor region "B". At least one second fin 252 may be formed on the semiconductor substrate 200 in the first MOS transistor region "B".

Further, the semiconductor substrate 200 may also include a first doped source/drain layer 241 formed in the second fin 252. The first doped source/drain layer 241 may be doped to have a first conductivity with a first type of source/drain doping ions. The conductive type of the first type of source/drain doping ions in the first doped source/drain layer 241 may be the same as the conductive type of the first type of doping ions in the first doped layer 221. In some embodiments, the semiconductor substrate may not include the first MOS transistor region "B".

In one embodiment, the top surfaces of the first fins 251 may be lower than the top surface of the second fin 252. In some embodiments, the top surfaces of the first fins 251 may level with the top surface of the second fin 252.

In one embodiment, the semiconductor substrate 200 may also include a second MOS transistor region "C". At least one third fin 253 may be formed on the semiconductor substrate 200 in the second MOS transistor region "C".

In one embodiment, the top surfaces of the first fins 251 may be lower than the top surface of the third fin 253. In some embodiments, the top surfaces of the first fins may level with the top surface of the third fin.

Further, in one embodiment, the semiconductor structure may also include an isolation structure 203 formed on the semiconductor substrate 200 in the diode region "A", the first MOS transistor region "B" and the second MOS transistor region "C".

In one embodiment, the top surface of the portion of the isolation structure 203 in the diode region "A" may be lower than the top surface of the portion of the isolation structure 203 in the first MOS transistor region "B". In some embodiments, the top surface of the portion of the isolation structure in the diode region may level with the top surface of the portion of the isolation structure in the first MOS transistor region.

In one embodiment, the top surface of the portion of the isolation structure 203 in the diode region "A" may be lower than the top surface of the portion of the isolation structure 203 in the second MOS transistor region "C". In some embodiments, the top surface of the portion of the isolation structure in the diode region may be below the top surface of the portion of the isolation structure in the second MOS transistor region.

In the disclosed method for fabricating a semiconductor structure, the second doped layer may be doped to have a second conductivity with a second type of doping ions. The conductive type of the second type of doping ions may be opposite to the conductive type of the first type of doping ions. Thus, the first doped layer and the second doped layer may form a diode. The interface between the first doped layer and the second doped layer may be the p-n junction interface of the diode. The second doped layer may be formed on the first doped layer, the size of the interface between the first doped layer and the second doped layer along the width direction of the first fin may be greater than the width of the first fin. Thus, the area of the interface between the first doped layer and the second doped layer may be relatively large. That is, the area of the p-n junction interface between the first doped layer and the second doped layer may be substantially large. Accordingly, the on-current of the diode may be increased; and the performance of the semiconductor structure may be improved.

Further, a partial thickness (i.e., the top portion) of the first fin may be removed. Thus, the top surface of the first fin may be lower than the top surface of the second fin. Thus, the height of the subsequently formed second doped layer may be reduced. Accordingly, the consumption of the second doped layer when performing the subsequent process may be reduced.

In the disclosed semiconductor structure, the area of the interface between the first doped layer and the second doped layer may be substantially large. That is, the area of the p-n junction interface between the first doped layer and the second doped layer may be substantially large. Thus, the on-current of the diode may be increased; and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a semiconductor substrate having at least one diode region;
    forming at least one first fin on the semiconductor substrate in the diode region;
    forming a first doped layer containing a first type of doping ions having a first conductivity in the first fin, wherein the first doped layer is formed on a top surface of the first fin without covering side surfaces of the first fin; and
    forming a second doped layer doped containing a second type of doping ions having a second conductivity opposite to the first conductivity on the first doped layer,
    wherein a size of an interface between the first doped layer and the second doped layer along a width direction of the first fin is greater than a width of the first fin.

2. The method according to claim 1, wherein forming the first doped layer comprises:
    forming a first epitaxial layer in the first fin; and performing a first doping process on the first epitaxial layer to dope a first type of doping ions into the first epitaxial layer.

3. The method according to claim 2, wherein:
the first epitaxial layer is made of one of silicon, silicon germanium and silicon carbide.

4. The method according to claim 1, wherein forming the second doped layer comprises:
forming a second epitaxial layer on a surface of the first doped layer; and
performing a second doping process on the second epitaxial layer to dope a second type of doping ions into the second epitaxial layer.

5. The method according to claim 4, wherein:
the second epitaxial layer is made of one of silicon, silicon germanium and the silicon carbide.

6. The method according to claim 1, wherein:
the first type of doping ions contained in the first doped layer include at least one of phosphorus ions, arsenic ions, and antimony ions, and the second type of doping ions contained in the second doped layer include at least of boron ions and $BF_2^+$ ions; or
the first type of doping ions contained in the first doped layer include at least one of boron ions and $BF_2^+$ ions, and antimony ions, and the second type of doping ions contained in the second doped layer include at least of phosphorus ions, arsenic ions.

7. The method according to claim 1, wherein the semiconductor substrate further comprises a first MOS transistor region and at least one second fin formed on the semiconductor substrate in the first MOS transistor region, the method further comprising:
forming a first doped source/drain layer doped with first source/drain doping ions having the first conductivity in the second fin.

8. The method according to claim 7, wherein forming the first doped source/drain layer comprises:
forming a first epitaxial layer in the first fin and the second fin; and
performing a first doping process on the first epitaxial layer to form the first doped layer in the diode region and the first doped source/drain layer in the first MOS transistor region.

9. The method according to claim 7, before forming the first doped layer, further comprising:
forming an isolation layer on the semiconductor substrate in the diode region and the first MOS transistor region;
forming an isolation structure by removing a partial thickness of the isolation layer in the diode region, such that the isolation layer in the diode region has a top surface lower than the isolation layer in the first MOS transistor region; and
removing a top portion of the first fin, such that the first fin has a top surface lower than the second fin after forming the isolation structure.

10. The method according to claim 1, wherein the semiconductor substrate further comprises a second MOS transistor region and at least one third fin formed on the semiconductor substrate in the second MOS transistor region, further comprising:
forming a second doped source/drain layer doped with second source/drain doping ions having a second conductivity in the third fin.

11. The method according to claim 10, wherein forming the second doped source/drain layer comprises:

forming a second epitaxial layer on the first doped layer and in the third fin in the second MOS transistor region; and
performing a second doping process on the second epitaxial layer to form the second doped layer on the first doped layer and the second doped source/drain layer in the third fin.

12. The method according to claim 10, before forming the first doped layer, further comprising:
forming an isolation layer on the semiconductor substrate in the diode region and the second MOS transistor region;
forming an isolation structure by removing a partial thickness of the isolation layer in the diode region, such that the isolation layer in the second MOS transistor region has a top surface lower than the isolation layer in the second MOS transistor region to; and
removing a top portion of the first fin, such that the first fin has a top surface lower than the third fin after forming isolation structure.

13. The method according to claim 1, wherein:
the first doped layer has a rectangular shape with a width in the width direction of the first fin greater than the width of the first fin.

14. A method for fabricating a semiconductor structure, comprising:
providing a semiconductor substrate having at least one diode region;
forming at least one first fin on the semiconductor substrate in the diode region;
forming a first doped layer containing a first type of doping ions having a first conductivity in the first fin, wherein forming the first epitaxial layer comprises:
forming an opening passing through the first fin along a width direction of the first fin; and
forming the first epitaxial layer in the opening by an epitaxial growth process; and
forming a second doped layer doped containing a second type of doping ions having a second conductivity opposite to the first conductivity on the first doped layer,
wherein a size of an interface between the first doped layer and the second doped layer along the width direction of the first fin is greater than a width of the first fin.

15. A semiconductor structure, comprising:
a semiconductor substrate having at least one diode region and at least one first fin on the semiconductor in the diode region;
a first doped layer containing a first type of doping ions having a first conductivity formed in the first fin;
a second doped layer a second type of doping ions having a second conductivity opposite to the first conductivity on the first doped layer, wherein a size of an interface between the first doped layer and the second doped layer along a width direction of the first fin is greater than a width of the first fin;
a first MOS transistor region;
at least one second fin formed on the semiconductor substrate in the first MOS transistor region; and
a first doped source/drain layer doped with a first type of source/drain doping ions having the first conductivity formed in the second fin.

16. The semiconductor structure according to claim 15, wherein:
the first doped layer is made of one of silicon, silicon germanium and silicon carbide; and the second doped layer is made of one of silicon, silicon germanium and silicon carbide.

17. The semiconductor structure according to claim 15, wherein:
a top surface of the first fin is lower than a top surface of the second fin.

18. The semiconductor structure according to claim 15, further comprising:
a second MOS transistor region;
at least one third fin formed on the semiconductor substrate in the second MOS transistor region; and
a second doped source/drain layer doped with a second type of source/drain doping ions having the second conductivity formed in the third fin.

19. The semiconductor structure according to claim 18, wherein:
a top surface of the second fin is lower than a top surface of the third fin.

20. The semiconductor structure according to claim 15, further comprising:
an isolation structure formed over the semiconductor substrate in the diode region, the first MOS transistor region and the second MOS transistor region, wherein:
a top surface of the isolation structure in the diode region is lower than a top surface of the isolation structure in the first MOS transistor region; and
the top surface of the isolation structure in the diode region is lower than a top surface of the isolation structure in the second MOS transistor region.

* * * * *